(12) United States Patent
Hashimoto et al.

(10) Patent No.: US 6,683,246 B2
(45) Date of Patent: Jan. 27, 2004

(54) ELECTRIC-WAVE ABSORBER

(75) Inventors: Osamu Hashimoto, 1-17-1-6, Nishi-hashimoto, Sagamihara-shi, Kanagawa 229-1131 (JP); Tetsu Soh, Hiratsuka (JP)

(73) Assignees: The Yokohama Rubber Co., LTD, Tokyo (JP); Osamu Hashimoto, Kanagawa (JP)

( * ) Notice: Subject to any disclaimer, the term of this patent is extended or adjusted under 35 U.S.C. 154(b) by 0 days.

(21) Appl. No.: 10/258,847

(22) PCT Filed: Jan. 24, 2002

(86) PCT No.: PCT/JP02/00504
§ 371 (c)(1), (2), (4) Date: Oct. 29, 2002

(87) PCT Pub. No.: WO02/060231
PCT Pub. Date: Aug. 1, 2002

(65) Prior Publication Data
US 2003/0079893 A1 May 1, 2003

(30) Foreign Application Priority Data
Jan. 25, 2001 (JP) .......................................... 2001-17333

(51) Int. Cl.[7] .............................................. H05K 9/00
(52) U.S. Cl. .............................. 174/35 MS; 250/515.1; 428/692
(58) Field of Search ........................... 174/35 R, 35 MS; 250/515.1, 518.1; 361/816, 818; 428/255, 256, 338, 692, 928

(56) References Cited

U.S. PATENT DOCUMENTS

| | | | |
|---|---|---|---|
| 4,948,922 A | | 8/1990 | Varadan et al. |
| 5,583,318 A | * | 12/1996 | Powell .................. 174/35 MS |
| 5,864,088 A | * | 1/1999 | Sato et al. ............. 174/35 MS |
| 6,372,354 B1 | * | 4/2002 | Park et al. .................. 428/447 |
| 6,436,541 B1 | * | 8/2002 | Sopko et al. ............... 428/432 |

FOREIGN PATENT DOCUMENTS

JP  06-263918 A1  9/1994

OTHER PUBLICATIONS

International Search Report of PCT/JP02/00504 mailed on Feb. 19, 2002.

* cited by examiner

Primary Examiner—Dean A. Reichard
Assistant Examiner—Carmelo Oliva
(74) Attorney, Agent, or Firm—Rader Fishman Grauer

(57) ABSTRACT

The radio wave absorber of the present invention has a radio wave reflector and at least two radio wave absorbing layers disposed on a surface of the radio wave reflector, the at least two radio wave absorbing layers being formed of a base material and electroconductive titanium oxide mixed with the base material. The radio wave absorbing layers have different blend ratios of the electroconductive titanium oxide so as to make their radio wave absorption property different.

8 Claims, 3 Drawing Sheets

ELECTRIC-WAVE ABSORBER

TECHNICAL FIELD

The present invention relates to a radio wave absorber for absorbing radio waves of a microwave band or a millimetric wave band, and more particularly, to a radio wave absorber that can obtain high radio wave absorption characteristics in a wide frequency range.

TECHNICAL BACKGROUND

Radio wave absorbers are widely used for marine vessels, aircraft, etc. Such a radio wave absorber absorbs radio waves emitted from one's radar and lowers the reflected radio waves to be returned to the radar, so that the presence can not be easily detected by the radar.

In recent years, studies for use of radio waves of a microwave band and a millimetric wave band have been briskly carried out in various fields. Such radio waves of a microwave band and a millimetric wave band might damage human bodies and equipment. Therefore, with the aforementioned studies, radio wave absorbers have been receiving public attention, as one of means for preventing radio wave interferences.

Conventionally, the radio wave absorber mentioned above comprises a radio wave reflecting plate and an radio wave absorbing layer, provided thereon, consisting of a single layer matching with the frequency of radio waves to be absorbed. The radio wave absorber of so-called "matching type absorption", for absorbing radio waves by using such a radio wave absorbing layer consisting of a single layer, as shown in FIG. 6, has a high radio wave absorption capacity in a frequency range before and after one frequency f. However, on the contrary, the frequency range to be absorbed is limited in a narrow range. As a result, it can not apply to fields other than those of marine vessels, aircraft, etc.

DISCLOSURE OF THE INVENTION

It is an object of the present invention to provide a radio wave absorber that can attain a high radio wave absorption capacity in a frequency range wider than before.

In order to achieve the aforementioned object, the radio wave absorber of the present invention is characterized by comprising a radio wave reflector and at least two radio wave absorbing layers disposed on a surface of the radio wave reflector, the at least two radio wave absorbing layers being formed of a base material and electroconductive titanium oxide blended therewith, and having different blend ratios of the electroconductive titanium oxide so as to make their radio wave absorption property different.

According to the radio wave absorber of the present invention, it becomes possible to obtain high radio wave absorption characteristics in a frequency range before and after each of the at least two frequencies. Therefore, a high radio wave absorption capacity can be achieved in a frequency range wider than the conventional radio wave absorber with a radio wave absorbing layer consisting of a single layer.

BEST MODES FOR CARRYING OUT THE INVENTION

The embodiments of the present invention will be described below with reference to the drawings.

Figure 1:
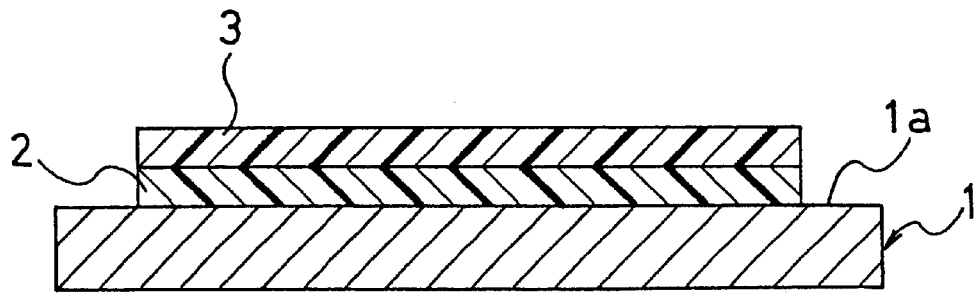
FIG. 1 is an enlarged section showing an example of the radio wave absorber of the present invention.

In FIG. 1, the radio wave absorber of the present invention comprises a radio wave reflector 1 made from a metal plate, and a first radio wave absorbing layer 2 and a second radio wave absorbing layer 3 disposed on a surface 1a of the radio wave reflector 1 and formed of a base material and electroconductive titanium oxide mixed therewith.

Figure 2:
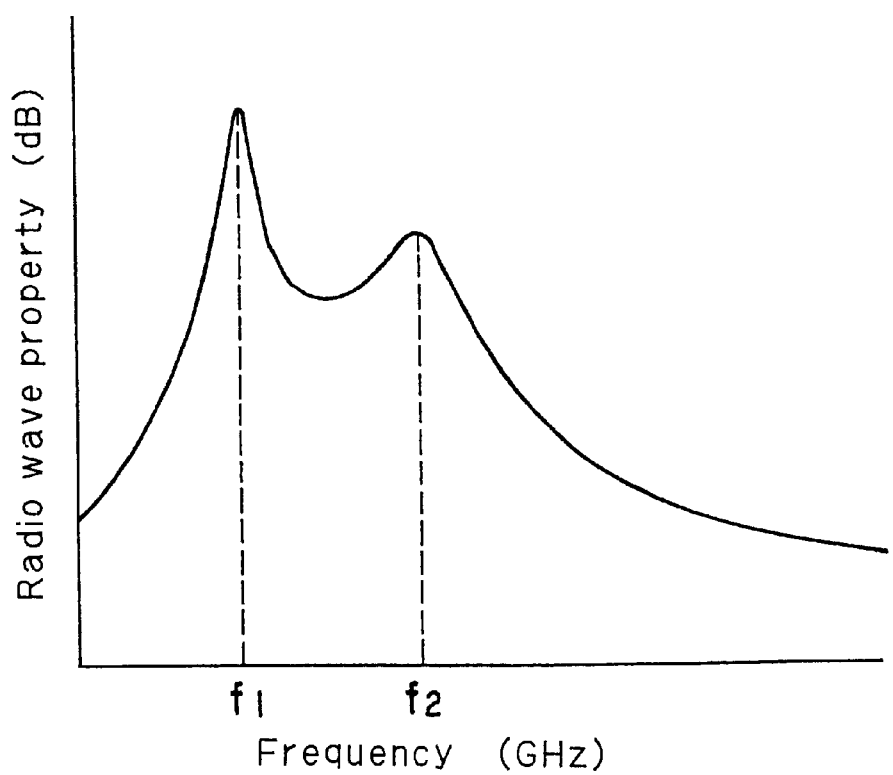
FIG. 2 is a graph showing the radio wave absorption property of the radio wave absorber in FIG. 1.

The two radio wave absorbing layers 2, 3 have different blend ratios of electroconductive titanium to the base material, and thereby, as shown in FIG. 2, present high radio wave absorption characteristics in a frequency range before and after each of two different frequencies f1, f2.

The base material used for the radio wave absorbing layers 2, 3, may be at least one selected from a group consisting of thermoplastic resin, thermosetting resin, rubber, elastomer, etc.

As the thermoplastic resin, preferably used can be, for example, polyolefin resin such as polyethylene, polypropylene, etc., polyamide resin such as nylon 6, nylon 66, etc., polyester resin such as polyethylene terephthalate, polybutylene terephthalate, etc., or a mixture thereof.

The thermosetting resin may be, for example, epoxy resin, polyurethane resin, polyester resin, phenol resin or the like. Setting agents to be used for the thermosetting resin can be conventional ones without any limitation of the kind thereof.

As the rubber, conventionally known various rubbers can be used, preferably including, for example, chloroprene rubber, silicone rubber, acrylonitrile butadiene rubber (NBR), etc.

As the aforementioned conductive titanium oxide, those conventionally known can be used and, for example, one having rutile type spherical crystals or rutile type needle crystals of titanium oxide the surfaces of which are covered with an electroconductive layer made of zinc dioxide/antimony ($SnO_2$/Sb) alloy may be preferably used. This electroconductive titanium oxide is excellent in physical and chemical stability, and can increase the permittivity of the radio wave absorbing layers 2, 3 by dispersing it in the base material.

According to the radio wave absorber of the present invention mentioned above, high radio wave absorption characteristics in a frequency range before and after each of two different frequencies f1, f2 can be obtained, as shown in FIG. 2, by laminating the two radio wave absorbing layers 2, 3 different in radio wave absorption property. Consequently, a high radio wave absorption capacity can be attained in a frequency range wider than the prior art.

Figure 3:
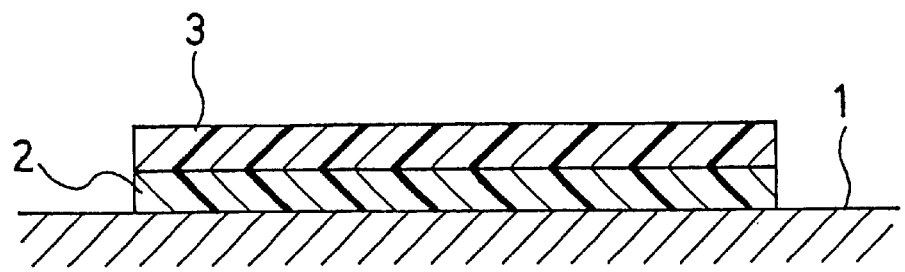
FIG. 3 is an enlarged section showing another example of the radio wave absorber of the present invention.

FIG. 3 shows another embodiment of the radio wave absorber of the present invention. This radio wave absorber is the radio wave absorber of FIG. 1 wherein the radio wave reflector 1 is formed from an already installed metal structure. An existing metal structure may be used as a radio wave reflector 1 in this way.

In the present invention, the blend ratio of the aforementioned electroconductive titanium oxide is preferably 1 to 50 parts by weight to 100 parts by weight of the base material. If the blend ratio is less than 1 part by weight, both a real part and an imaginary part of the complex relative permittivity of the radio wave absorbing layers 2, 3 become too low, making difficult to match the radio wave absorbing layers 2, 3 to the waves of a microwave band and a millimetric wave band. On the contrary, if it exceeds 50 parts by weight, both a real part and an imaginary part of the complex relative permittivity of the radio wave absorbing layers 2, 3 become too high, making impossible to match the radio wave absorbing layers 2, 3 to the waves of a microwave band and a millimetric wave band, as well.

As the other material for increasing the permittivity of the radio wave absorbing layers 2, 3, electroconductive carbon black is preferably blended with the base material of the radio wave absorbing layers 2, 3, in addition to the aforementioned electroconductive titanium oxide. The addition of electroconductive carbon black increases a real part and an imaginary part of the complex relative permittivity of the radio wave absorbing layers 2, 3, thereby allowing the radio wave absorbing layers to be thinner without affecting the radio wave absorption property.

The blend ratio of conductive carbon black may be more than 0 part by weight and 4 or less parts by weight to 100 parts by weight of the base material. If it exceeds 4 parts by weight, the viscosity of a mixed material increases and, as a result, its workability deteriorates. Electroonductive carbon black may be blended in respective radio wave absorbing layers, or in either one of them.

The conductive carbon black may be, for example, acetylene black, furnace black, Ketjenblack or the like. Preferably, Ketjenblack is advantageous because of its high conductivity.

The radio wave absorbing layers 2, 3 mentioned above may have an identical thickness or different thickness. The radio wave absorption property of a radio wave absorbing layer is determined by its composition contents and thickness, and the radio wave absorption property of the radio wave absorbing layers 2, 3 may be modified by changing the thickness.

The radio wave absorber mentioned above can be easily obtained by forming the radio wave absorbing layer 2 by applying the material of the radio wave absorbing layer 2 onto the surface 1a of the radio wave reflector 1 and, after setting of the material, by forming the radio wave absorbing layer 3 by applying the material of the radio wave absorbing layer 3. Otherwise, it may be formed by disposing previously molded but not set radio wave absorbing layers 2, 3 onto the surface 1a of the radio wave reflector 1 in that order by an adhesive.

In the above embodiments of the present invention, examples using two radio wave absorbing layers 2, 3 different in radio wave absorption property by changing the blend ratio of electroconductive titanium oxide is described, but the radio wave absorber may be formed by lamination of three or more radio wave absorbing layers different in radio wave absorption property. Provision of three or more radio wave absorbing layers permits to obtain high radio wave absorption characteristics in a frequency range before and after each of three or more frequencies, thereby attaining a high radio wave absorption capacity in a wider frequency range.

EXAMPLE 1

A mixture of an epoxy resin and a setting agent was used as a base material, and each material of a first and a second radio wave absorbing layers was obtained by adding an electroconductive titanium oxide and an electroconductive carbon black to the mixture with the ratio shown in Table 1, then by adding a solvent thereto, and by mixing the resultant mixture with stirring in a mill. The quantity of the solvent used was 20 parts by weight to 80 parts by weight of the above composition.

The material of the first radio wave absorbing layer was applied by spraying onto an aluminum reflecting plate to form the first radio wave absorbing layer. After the setting of the first radio wave absorbing layer, the material of the second radio wave absorbing layer was sprayed thereon to form the second radio wave absorbing layer, thereby obtaining the radio wave absorber composed as shown in FIG. 1. The thickness of the first and second radio wave absorbing layers was shown in Table 1.

Figure 4:
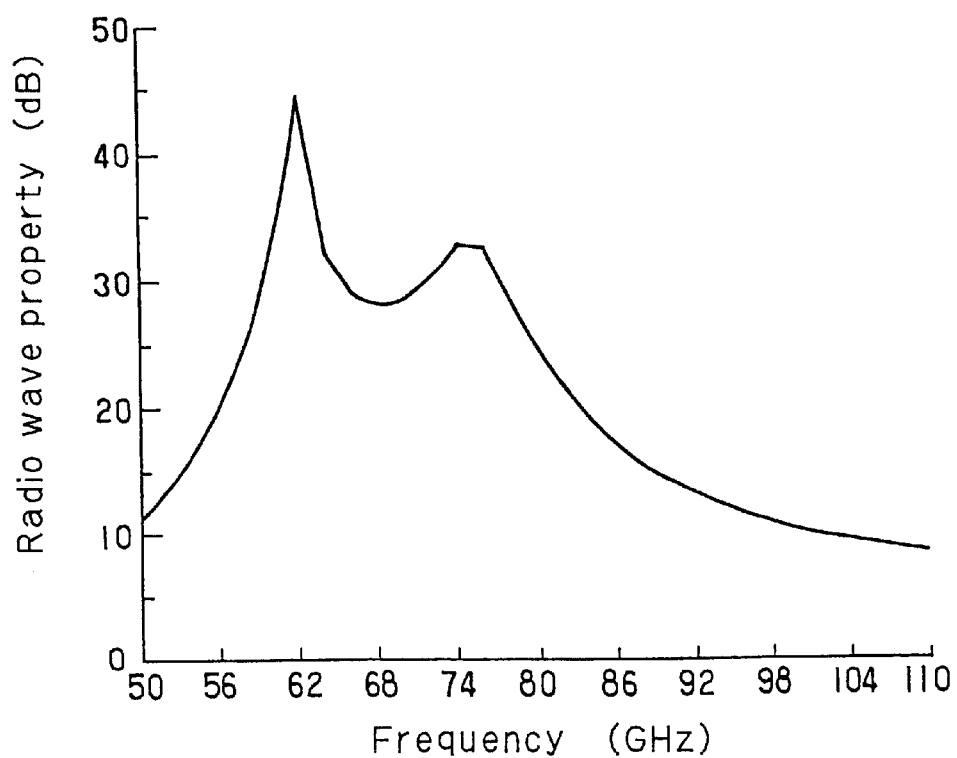
FIG. 4 is a graph showing the radio wave absorption property of the radio wave absorber of a first example.

Waves of a millimetric wave band (frequency: 50 to 110 GHz) was subjected to incidence onto the surface of the second radio wave absorbing layer of the obtained radio wave absorber with an incident angle of 4° to evaluate the radio wave absorption capacity. The result was shown in FIG. 4.

TABLE 1

|  | First radio wave absorbing layer | Second radio wave absorbing layer |
| --- | --- | --- |
| Base material (part by weight) | 100 | 100 |
| Conductive titanium oxide (#1) (part by weight) | 32.9 | 1.2 |
| Conductive carbon black (#2) (part by weight) | 3.3 | 0.6 |
| Thickness (mm) | 1.0 | 0.57 |

(#1) Needle type conductive titanium oxide FT2000 (trade name manufactured by Ishihara Sangyo)
(#2) Ketjenblack (trade name manufactured by Nihon E.C.)

From FIG. 3, it can be understood that the radio wave absorber of the present invention presents a high radio wave absorption property in a frequency range before and after each of two frequencies (about 60 GHz and about 76 GHz), thereby allowing to attain a high radio wave absorption capacity in a frequency range wider than before.

Radio wave absorbers exhibiting a high radio wave absorption property in a frequency range before and after each of the frequencies of 60 GHz and 76 GHz can be effectively employed as radio wave absorbers for absorbing radio waves of radars (using radio waves of 60 GHz and 76 GHz) for measuring a distance between vehicles.

EXAMPLE 2

As in the example 1, a radio wave absorber was obtained. The blend ratios of epoxy resin, conductive titanium oxide and conductive carbon black, and the thickness of the first and second radio wave absorbing layers were shown in Table 2.

Waves of a millimetric wave band was subjected to incidence onto the surface of the second radio wave absorbing layer of the obtained radio wave absorber under the same conditions as in the example 1 to evaluate the radio wave absorption capacity. The result was shown in FIG. 5.

TABLE 2

| | First radio wave absorbing layer | Second radio wave absorbing layer |
|---|---|---|
| Base material (part by weight) | 100 | 100 |
| Conductive titanium oxide (#1) (part by weight) | 40.0 | 2.0 |
| Conductive carbon black (#2) (part by weight) | 2.0 | 0 |
| Thickness (mm) | 0.82 | 0.47 |

(#1) Needle type conductive titanium oxide FT2000 (trade name manufactured by Ishihara Sangyo)
(#2) Ketjenblack (trade name manufactured by Nihon E.C.)

Figure 5:
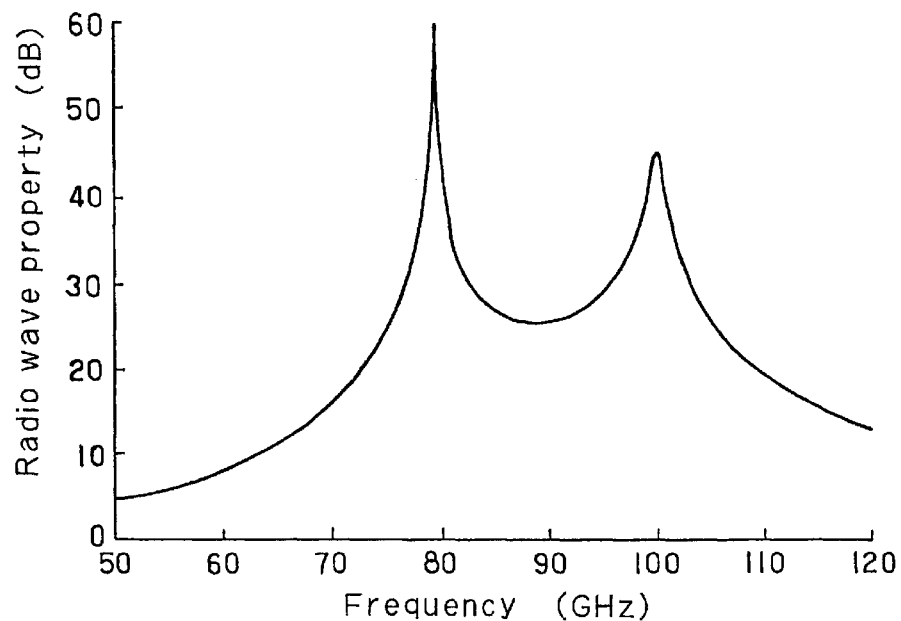
FIG. 5 is a graph showing the radio wave absorption property of the radio wave absorber of a second example.
Figure 6:
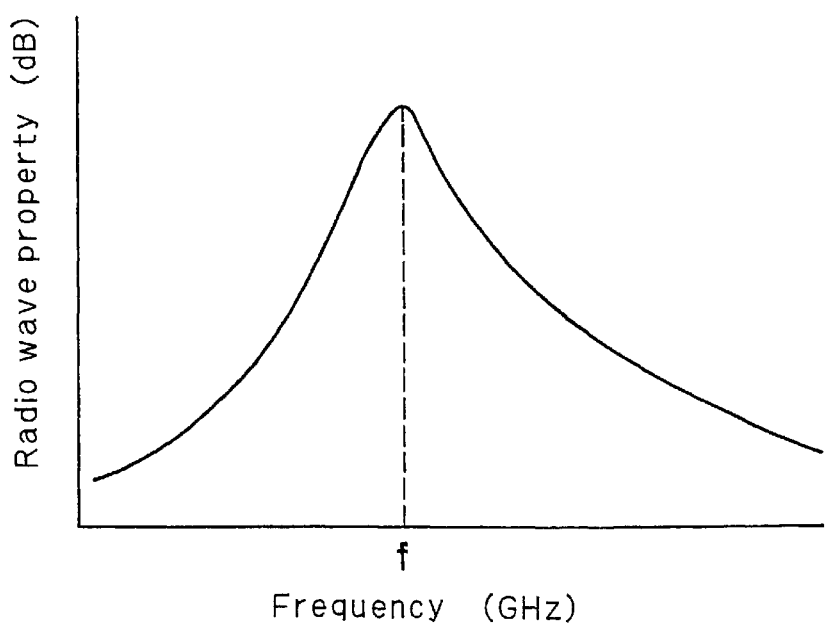
FIG. 6 is a graph showing the radio wave absorption property of a conventional radio wave absorber.

From FIG. 5, it can be understood that the radio wave absorber of the present invention presents a high radio wave absorption property in a frequency range before and after each of two frequencies (about 78 GHz and about 99 GHz), thereby allowing to attain a high radio wave absorption capacity in a frequency range wider than before.

As mentioned above, the present invention provides a radio wave absorber comprising a radio wave reflector and at least two radio wave absorbing layers disposed on a surface thereof, the at least two radio wave absorbing layers being formed of a base material and electroconductive titanium oxide mixed therewith and having the different blend ratios of the electroconductive titanium oxide so as to make their radio wave absorption property different, thereby allowing to obtain a high radio wave absorption property in a frequency range before and after each of the at least two frequencies. Accordingly, a high radio wave absorption capacity can be attained in a frequency range wider than the prior art.

INDUSTRIAL APPLICABILITY

The present invention having the aforementioned excellent effects can be very effectively applied to radio wave absorbers used in the fields of marine vessels, aircraft and the like, and also to radio wave absorbers for absorbing radio waves of a microwave band or a millimetric wave band that may provoke a trouble of human bodies and equipment.

What is claimed is:

1. A radio wave absorber comprising a radio wave reflector and at least two radio wave absorbing layers disposed on a surface thereof, the at least two radio wave absorbing layers being formed of a base material and electroconductive titanium oxide blended therewith and having different blend ratios of said electroconductive titanium oxide so as to make a radio wave absorption property of the at least two radio wave absorbing layers different, wherein the respective radio wave absorbing layers absorb radio waves in different frequency ranges.

2. The radio wave absorber of claim 1, wherein said blend ratios of the electroconductive titanium oxide is 1 to 50 parts by weight to 100 parts by weight of the base material.

3. The radio wave absorber of claim 1 or 2, wherein at least one of the two radio wave absorbing layers contains 4 or less parts by weight of electroconductive carbon black to 100 parts by weight of the base material.

4. The radio wave absorber of claim 3, wherein the thickness of said two radio wave absorbing layers is different.

5. The radio wave absorber of claim 4, wherein said radio wave reflector is formed from a metal plate.

6. The radio wave absorber of claim 4, wherein said radio wave reflector is formed from a metal structure.

7. The radio wave absorber of claim 6, wherein said base material is at least one material selected from a group consisting of thermoplastic resin, thermosetting resin, rubber, and thermoplastic elastomer.

8. A radio wave absorber comprising:
a radio wave reflector;
a first radio wave absorbing layer disposed on the radio wave reflector; and
a second radio wave absorbing layer disposed on the first radio wave absorbing layer to form a stacked layer construction,
wherein each one of the first and second radio wave absorbing layers is a mixture of a base material and electroconductive titanium oxide mixed together with the first radio wave absorbing layer mixture having a blend ratio of said electroconductive titanium oxide and said base material different than the second radio wave absorbing layer mixture thereby rendering a first radio wave absorption property of the first radio wave absorbing layer different than a second radio wave absorption property of the second radio wave absorbing layer.

* * * * *